(12) United States Patent
Kanno

(10) Patent No.: US 9,490,180 B2
(45) Date of Patent: Nov. 8, 2016

(54) METHOD FOR PROCESSING WAFER

(75) Inventor: Shinya Kanno, Nishishirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 361 days.

(21) Appl. No.: 14/344,191

(22) PCT Filed: Aug. 30, 2012

(86) PCT No.: PCT/JP2012/005474
§ 371 (c)(1),
(2), (4) Date: Mar. 11, 2014

(87) PCT Pub. No.: WO2013/051184
PCT Pub. Date: Apr. 11, 2013

(65) Prior Publication Data
US 2014/0320867 A1 Oct. 30, 2014

(30) Foreign Application Priority Data

Oct. 4, 2011 (JP) .................................. 2011-220143

(51) Int. Cl.
| | |
|---|---|
| *G01B 11/28* | (2006.01) |
| *H01L 21/66* | (2006.01) |
| *B24B 37/013* | (2012.01) |
| *B24B 37/08* | (2012.01) |
| *B24B 49/12* | (2006.01) |

(Continued)

(52) U.S. Cl.
CPC .................. *H01L 22/12* (2013.01); *B24B 7/17* (2013.01); *B24B 37/013* (2013.01); *B24B 37/08* (2013.01); *B24B 37/28* (2013.01); *B24B 49/12* (2013.01); *G01B 11/0608* (2013.01); *H01L 22/20* (2013.01)

(58) Field of Classification Search
CPC combination set(s) only.
See application file for complete search history.

(56) References Cited

U.S. PATENT DOCUMENTS

| | | |
|---|---|---|
| 2011/0064971 A1 | 3/2011 | Kimura et al. |
| 2011/0130073 A1 | 6/2011 | Furukawa et al. |
| 2012/0329373 A1 | 12/2012 | Ueno et al. |

FOREIGN PATENT DOCUMENTS

| | | |
|---|---|---|
| JP | U-62-195446 | 12/1987 |
| JP | A-2-106269 | 4/1990 |

(Continued)

OTHER PUBLICATIONS

International Preliminary Report on Patentability issued in International Patent Application No. PCT/JP2012/005474 mailed Apr. 8, 2014.

(Continued)

*Primary Examiner* — Tri T Ton
(74) *Attorney, Agent, or Firm* — Oliff PLC

(57) ABSTRACT

The invention provides a method for processing a wafer by inserting the wafer into a holding hole of a carrier to hold the wafer, and interposing the carrier holding the wafer between an upper turn table and a lower turn table to process both surfaces of the wafer simultaneously, including: before processing the wafer, detecting a height position of the upper turn table by a laser displacement sensor while interposing the carrier holding the wafer between the upper turn table and the lower turn table; and determining that the wafer is not normally held to redo the holding of the wafer if a difference between the detected height position and a reference position exceeds a threshold. The method can automatically detect accurately a failure in holding the wafer before processing to prevent the wafer from breaking and eliminate the necessity of operator's inspection using touch to improve operation efficiency.

4 Claims, 5 Drawing Sheets

(51) Int. Cl.
  *B24B 7/17*     (2006.01)
  *G01B 11/06*    (2006.01)
  *B24B 37/28*    (2012.01)

(56) References Cited

FOREIGN PATENT DOCUMENTS

| | | |
|---|---|---|
| JP | A-4-25371 | 1/1992 |
| JP | A-6-270054 | 9/1994 |
| JP | A-7-112365 | 5/1995 |
| JP | A-10-180624 | 7/1998 |
| JP | A-11-285969 | 10/1999 |
| JP | A-2006-224233 | 8/2006 |
| JP | A-2008-36802 | 2/2008 |
| JP | A-2010-221348 | 10/2010 |
| JP | A-2011-62776 | 3/2011 |
| TW | 201021109 A1 | 6/2010 |
| TW | 201130600 A1 | 9/2011 |

OTHER PUBLICATIONS

Office Action issued in Japanese Patent Application No. 2011-220143 dated Jul. 1, 2014 (with partial translation).
Oct. 14, 2015 Taiwanese Office Action and Search Report issued in Taiwanese Patent Application No. 101134144.
International Search Report issued in International Patent Application No. PCT/JP2012/005474 mailed Oct. 23, 2012.

METHOD FOR PROCESSING WAFER

TECHNICAL FIELD

The present invention relates to a method for processing a wafer including holding a wafer in a holding hole of a carrier and processing both surfaces of the wafer, and particularly to a method for detecting that the wafer is not normally held in the holding hole to prevent the wafer from breaking.

BACKGROUND ART

In the past, a method for producing a semiconductor wafer such as a silicon mirror-polished wafer has been generally formed of a slicing process of slicing a single crystal rod produced by a single crystal producing apparatus to obtain a thin disk-shaped wafer, a chamfering process of chamfering an outer edge portion of the wafer obtained by the slicing process to prevent a fracture and a chip in the wafer, a lapping process of lapping the chamfered wafer to flatten the wafer, an etching process of removing mechanical damage remaining on the front surface of the chamfered and lapped wafer, a polishing process of polishing the front surface of the etched wafer to a mirror-smooth state, and a cleaning process of cleaning the polished wafer.

Moreover, as the flattening process, in addition to lapping, a technique called double-head grinding by which both sides are ground at the same time by using a grindstone is also used. Furthermore, as the polishing process, there are double-side polishing by which both sides are polished at the same time and single-side polishing by which one side is polished.

Incidentally, an object of the lapping process is, for example, to provide the wafer obtained by slicing with a predetermined thickness and achieve necessary shape accuracy such as flatness and parallelism thereof. In general, it is known that the wafer subjected to lapping processing has the highest shape accuracy and it is said that this shape accuracy determines the final shape of the wafer; therefore, the shape accuracy in the lapping process is very important.

Moreover, as a lapping technique, a lapping apparatus that performs lapping by imparting relative motion to turn tables and wafers by combining three types of motion: rotation motion of concentric turn tables, orbital motion of a circular wafer holding carrier with respect to an apparatus main body, and rotation motion of the circular wafer holding carrier has been known (refer to, for example, Patent Document 1). This lapping apparatus is configured as depicted in FIGS. 5(A) and (B), for example.

As depicted in FIGS. 5(A) and (B), a lapping apparatus 101 has an upper turn table 103 and a lower turn table 104 which are provided in such a way as to face each other in a vertical direction. These upper and lower turn tables 103 and 104 are rotated by an unillustrated drive unit in opposite directions. The lower turn table 104 has a sun gear 110 in the center on a top face thereof, and a ring-shaped internal gear 109 is provided at the edge thereof.

Moreover, on the outer periphery of each wafer holding carrier 102, a gear section 111 that engages the sun gear 110 and the internal gear 109 is formed, and a gear structure is formed on the whole. In the wafer holding carriers 102, a plurality of holding holes 107 are provided. Wafers W to be lapped are inserted into the holding holes 107 and are held.

The carriers 102 holding the wafers are sandwiched between the upper and lower turn tables 103 and 104 and execute a planet gear movement, that is, make rotation and revolution between the upper and lower turn tables 103 and 104 that rotate while facing each other. To perform lapping, a turbid solution containing polishing abrasive grains such as aluminum oxide ($Al_2O_3$) or silicon carbide (SiC) and a liquid such as water containing a surface-active agent, the turbid solution called slurry, is poured out of a nozzle into a space between the upper and lower turn tables 103 and 104 through a through-hole 112 provided in the upper turn table 103 to send the abrasive grains between the wafers W and the upper and lower turn tables 103 and 104, and the shapes of the upper and lower turn tables 103 and 104 are transferred to the wafers W. Since the upper and lower turn tables and the carriers wear with use, it is necessary to replace the upper and lower turn tables and the carriers with new ones after they are used for a given period of time.

Moreover, to stop processing when the thickness of the wafers has become a target thickness, processing is performed with the thickness of the wafers being measured. As a method for performing processing while measuring the thickness of the wafers, a crystal sizing method, for example, is known (refer to Patent Document 2).

The crystal sizing method uses a piezoelectric effect that is produced when a crystal held in a holding hole of a carrier is processed with wafers and is a method by which the thickness of the wafers is measured indirectly by measuring the thickness of the crystal by using the fact that the frequency becomes high as the crystal becomes thinner.

CITATION LIST

Patent Literature

Patent Document 1: Japanese Unexamined Patent Application Publication No. H10-180624
Patent Document 2: Japanese Unexamined Patent Application Publication No. H11-285969

SUMMARY OF INVENTION

Technical Problem

Wafers W and a crystal are inserted into the holding holes of the carrier by an operator or a robot arm. At this time, a wafer sometimes does not fit in the holding hole of the carrier properly, or is protruded from the holding hole due to rotation of the turn tables, resulting in the wafer being out of place (hereinafter referred to as a failure in holding). Operators accordingly need to inspect the wafer and the crystal by touch after the wafer and the crystal are inserted into the holding holes of the carrier. Such a direct inspection by operator's touch takes time and is inefficient. Moreover, operators may overlook the failure in holding and start the processing, resulting in breaks of the wafer and the crystal. Such a problem could arise not only in the above-described lapping but also in double-side polishing by which both surfaces of the wafer are polished at the same time.

The present invention has been made in view of the above-described problems, and an object thereof is to provide a method for processing a wafer that can automatically detect accurately whether the wafer is not normally held, due to the failure in holding, before processing to prevent the wafer from breaking and eliminate the necessity of operator's inspection using touch to improve operation efficiency, upon inserting the wafer into a holding hole of a carrier to hold the wafer, and interposing the carrier holding the wafer between an upper turn table and a lower turn table to process both surfaces of the wafer at the same time.

Solution to Problem

To accomplish the above-described object, the present invention provides a method for processing a wafer by inserting the wafer into a holding hole of a carrier to hold the wafer, and interposing the carrier holding the wafer between an upper turn table and a lower turn table to process both surfaces of the wafer at the same time, comprising the steps of: before processing the wafer, detecting a height position of the upper turn table by a laser displacement sensor while interposing the carrier holding the wafer between the upper turn table and the lower turn table; and determining that the wafer is not normally held to redo the holding of the wafer if a difference between the detected height position and a reference position exceeds a threshold.

Such a method can eliminate the necessity of the operator's inspection using touch and automatically detect the failure in holding accurately, thereby processing the wafer efficiently while preventing the wafer from breaking.

The reference position is preferably a height position of the upper turn table detected, before the detecting step, by the laser displacement sensor while interposing the carrier holding no wafer between the upper turn table and the lower turn table.

In this manner, the failure in holding can be detected accurately without being affected by variations in thickness of the turn tables and carrier, which are caused by repeating the processing of wafers.

The method may include holding a crystal for measuring a thickness of the wafer in a holding hole provided in the carrier separately from the holding hole for holding the wafer to determine whether the crystal is not normally held, together with determining that the wafer is not normally held.

Such a method can also automatically detect a failure in holding of the crystal, by which the thickness of the wafer to be processed is measured.

The laser displacement sensor is preferably a CCD laser micrometer.

The CCD laser micrometer can detect the height position of the upper turn table more accurately, thereby enabling the failure in holding to be more accurately detected.

Advantageous Effects of Invention

The method of the present invention involves detecting the height position of an upper turn table by a laser displacement sensor while interposing a carrier holding a wafer between the upper turn table and a lower turn table, and determining that the wafer is not normally held to redo the holding of the wafer if the difference between the detected height position and a reference position exceeds a threshold, before interposing the carrier holding the wafer between the upper turn table and the lower turn table to process both surfaces of the wafer at the same time. The method can therefore eliminate the necessity of the operator's inspection using touch and automatically detect the failure in holding accurately, thereby processing the wafer efficiently while preventing the wafer from breaking.

DESCRIPTION OF EMBODIMENTS

Hereinafter, embodiments of the present invention will be described, but the present invention is not limited to these embodiments.

In a process, such as lapping or double-side polishing, in which a carrier holding a wafer is interposed between upper and lower turn tables and both surfaces of the wafer are processed at the same time, the wafer may not be properly retained in a holding hole of the carrier, that is, a failure in holding may occur. Conventionally, operators accordingly need to inspect by touch after the wafer and, if needed, a crystal are inserted in the corresponding holding holes of the carrier.

The present inventor considered how the failure in holding can be automatically detected without the inspection by operator's touch, and found that the failure in holding deviates the height position of the upper turn table from a proper position when the carriers is interposed between the upper and lower turn tables, and can be accurately detected by detecting the deviation of the height position of the upper turn table by a laser displacement sensor. The present inventor thereby brought the present invention to completion.

The present invention is directed to a method for processing a wafer by which the wafer is inserted into a holding hole of a carrier, the carrier holding the wafer is sandwiched between upper and lower turn tables, and both surfaces of the wafer are processed at the same time, and can be applied to double-side lapping and double-side polishing, for example.

A method for processing a wafer by double-side lapping of the invention will now be described by way of example.

Figure 1A:
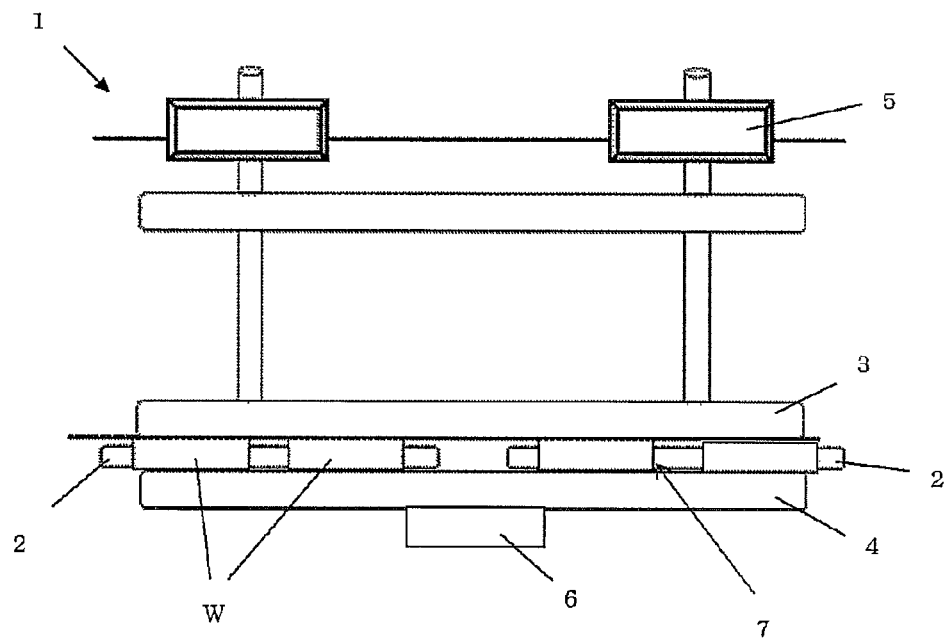
FIG. 1A is a schematic view of an example of a lapping apparatus that can be used in a method for processing a work of the present invention.
Figure 1B:
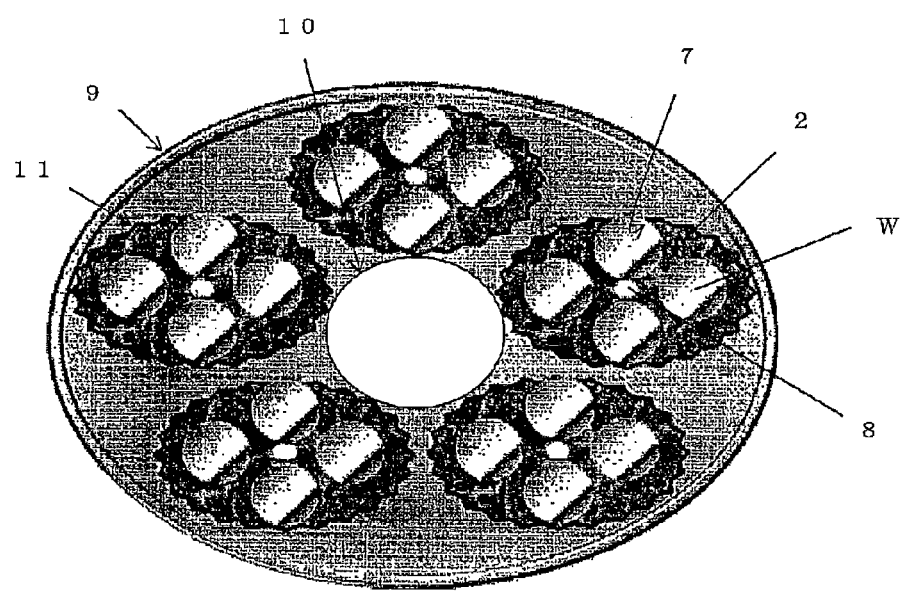
FIG. 1B is a top schematic view of the apparatus in FIG. 1A.

FIG. 1A and FIG. 1B are schematic views of an example of a lapping apparatus that can be used in a method for processing a wafer of the present invention. As depicted in FIG. 1A, a lapping apparatus 1 has an upper turn table 3 and a lower turn table 4 that are disposed so as to face each other in a vertical direction. The upper turn table 3 remains at rest, and the lower turn table 4 is rotated by a drive unit 6.

As depicted in FIG. 1B, the lower turn table 4 has a sun gear 10 in the center on a top face thereof, and an annular internal gear 9 is provided at the edge thereof. The sun gear 10 and the internal gear 9 are engaged with a gear 11 formed on the outer circumferential surface of each carrier 2 holding wafers W, and these gears constitute a gear structure on the whole.

In the carrier 2, a plurality of holding holes 7 are provided. Wafers W to be lapped are placed in the respective holding holes 7 and are held.

Each of the carriers 2 holding the wafers W is interposed between the upper and lower turn tables 3 and 4, and is rotated about its axis and revolved around the rotating axis of the lower turn table between the rotating lower turn table 4 and the upper turn table 3 remaining at rest (i.e., a planet gear movement). Although the lapping apparatus depicted in FIG. 1A is of a three-way type in which the lower turn table 4, the sun gear 10, and the internal gear 9 each rotate, the invention can also employ a lapping apparatus of a four-way type in which the upper turn table 3, the lower turn table 4, the sun gear 10, and the internal gear 9 each rotate.

Before the wafers W are lapped with such a lapping apparatus, the wafers W are inserted and held in the holding holes 7 of each of the carriers 2. At this time, a crystal for measuring the thickness of the wafers W may also be inserted and held in a holding hole provided in each of the carriers separately from the holding holes 7 for holding the wafers. As depicted in FIG. 1B, the crystal 8 is held in the holding hole located in the center of each of the carriers, and around the central holding hole are located the holding holes 7 in which the wafers W are held, for example. The wafers and the crystals are inserted into the holding holes by an operator or a robot arm.

As depicted in FIG. 1A, each of the carriers that thus hold the wafers is interposed between the upper and lower turn tables 3 and 4. In this state, the height position of the upper turn table 3 is detected by a laser displacement sensor 5. The difference between the detected height position and a reference position (a proper position) is calculated. Here, a plurality of the height positions are preferably detected at multiple measurement points by using a plurality of the laser displacement sensors, although the number of the laser displacement meters is not particularly limited. As depicted in FIG. 1A, the laser displacement sensors may be disposed on the respective shafts configured to move along with an up and down movement of the upper turn table, for example. Alternatively, as many laser displacement sensors as the carriers may be used to measure the height positions of the upper turn table above the corresponding carriers, enabling the failure in holding to be more surely detected.

The laser displacement sensors are thus used to detect the height positions at the multiple measurement points, and the differences between the respective height positions and a predetermined reference position are calculated. The predetermined reference position is preferably a height position when the failure in holding does not occur, i.e., in a normal state. In this manner, the failure in holding can be more surely detected, irrespective of a location at which the failure in holding has occurred, even when the failure in holding has occurred at multiple locations.

Alternatively, the reference position may be set to any one of the detected height positions to calculate the differences. The present invention of course includes calculating a difference between a single height position of the upper turn table measured at a single measurement point and the reference position.

Moreover, use of the laser displacement sensor allows the height position of the upper turn table with a high degree of precision.

Figure 2:
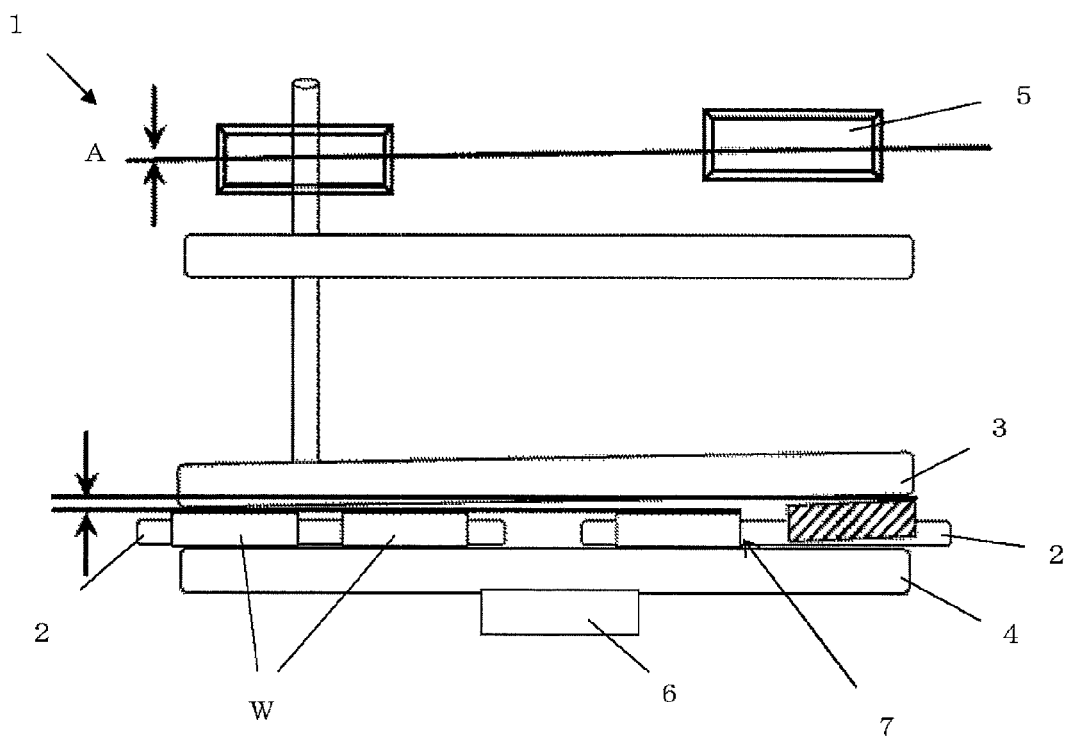
FIG. 2 is a schematic view illustrating how a failure in holding is detected in a method for processing a work of the present invention.

As depicted in FIG. 2, when the failure in holding a wafer or a crystal in the holding hole occurs, the height position of the upper turn table is deviated from a proper position, i.e., the reference position, at a region corresponding to the failure ('A' of FIG. 2). The failure can accordingly be detected by evaluating the difference between these positions. More specifically, a threshold is provided for the difference between the detected height position and the reference position, and it is determined that the wafer(s) is/are not normally held to redo the holding of the wafer (s) if the difference exceeds the threshold. It is determined that the wafer(s) is/are normally held if the difference does not exceed the threshold at all the measurement points.

The lapping is started after removing the failure in holing the wafer. More specifically, a turbid solution (called slurry) of polishing abrasive grains, such as aluminum oxide ($Al_2O_3$) or silicon carbide (SiC), and a liquid, such as water, containing a surfactant is supplied from a nozzle into a space between the upper and lower turn tables 3 and 4 through a through-hole provided in the upper turn table 3 to feed the abrasive grains between the wafers W and the upper and lower turn tables 3 and 4, and both surfaces of the wafers W are lapped.

Such a method can accurately detect the failure in holding the wafer and the crystal without the inspection by operator's touch, and be readily automated by using a controller that automatically controls to evaluate the difference between the detected height position and the reference position and to stop processing of the wafer if the failure in holding is detected. The method can therefore process the wafer while preventing the wafer and, if used, the crystal from breaking.

At this time, the reference position is preferably a height position of the upper turn table detected, before the above detection of the height position of the upper turn table, by the laser displacement sensor while interposing the carrier holding no wafer between the upper turn table and the lower turn table.

As processing of wafers is repeated, the thickness of the turn tables, the carriers, polishing pads of a polishing apparatus, etc., changes over time. Also, cleaning or maintenance of an apparatus may slightly change the position of the turn tables. These changes may deviate the reference position, which has been set as a proper position, from the proper position. Resetting the reference position to a proper position before every processing of wafers in the above manner advantageously enables the failure in holding to be surely detected with a high degree of precision.

Alternatively, the reference position used in next processing may be set to a height position of the upper turn table when it is determined that the wafer is normally held in current processing to reduce a setting time of the reference position, instead of resetting the reference position by detecting the height position of the upper turn table each time prior to detection of the height position of the upper turn table in the above manner.

Figure 3A:
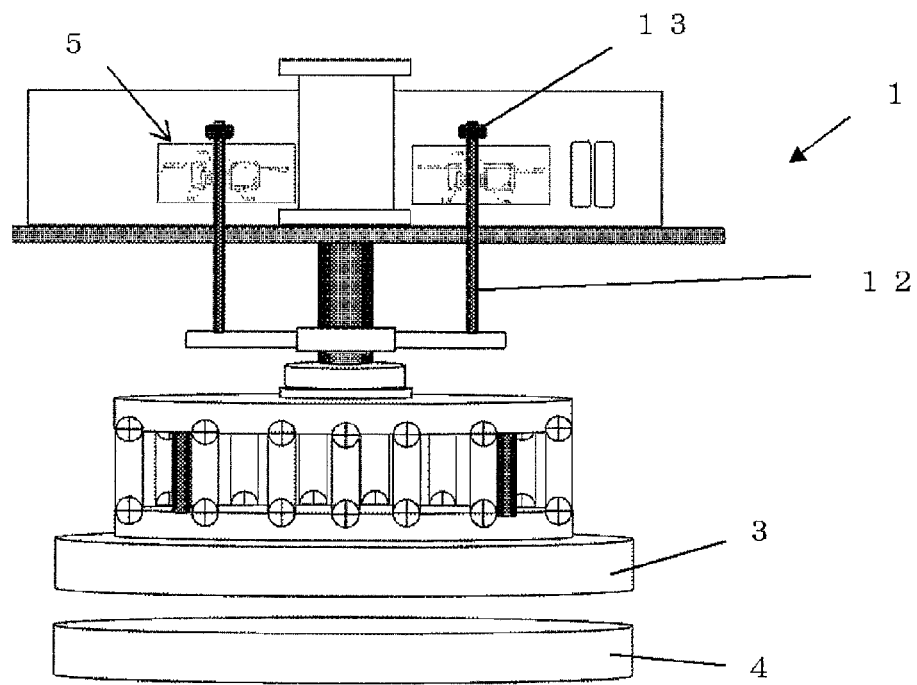
FIG. 3A is a schematic view of an exemplary method of mounting a laser displacement sensor that is used in a method for processing a work of the present invention.
Figure 3B:
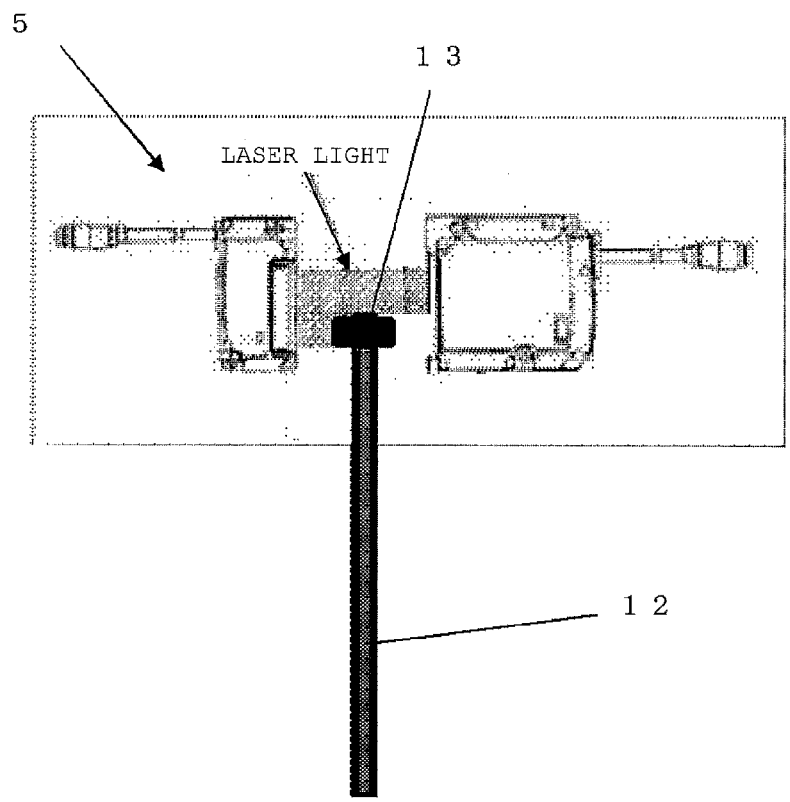
FIG. 3B is an enlarged view of an area near the laser displacement meter in FIG. 3A.

The laser displacement sensor 5 is preferably a CCD digital laser micrometer of a transmission type, as depicted in FIG. 3A and FIG. 3B. As depicted in FIG. 3B, a sensor dog 13 is disposed in a shaft 12 that is movable upward and downward along an up and down movement of the upper turn table 3, and the sensor dog 13 is positioned to blocks a laser when the carriers holding the wafers are interposed between the upper and lower turn tables.

By doing so, it is possible to detect the height position of the upper turn table and hence the failure in holding with a higher degree of precision. Moreover, the method for processing a wafer of the present invention can be readily applied to both a lapping apparatus and a double-side polishing apparatus regardless of a type of and a structure of an apparatus.

Furthermore, the difference between the height position of the upper turn table and the reference position may be evaluated not only before but also during processing of wafers to detect an abnormality such as the wafers and, if needed, a crystal being protruded from the holding holes.

EXAMPLES

Hereinafter, the present invention will be described more specifically with an example and a comparative example of the present invention, but the present invention is not limited to these examples.

Example

In accordance with the method for processing a wafer of the present invention, 300-mm-diameter silicon wafers were lapped with the lapping apparatus depicted in FIG. 1A and FIG. 1B to evaluate how accurately a failure in holding is detected. At this time, two CCD digital laser sensors of a transmission type (IG028 manufactured by KEYENCE Corporation) were used as the laser displacement sensors. As depicted in FIG. 3, the two sensors were provided on the respective shafts, disposed on the opposite sides with respect to a center shaft. Repeated checks of the accuracy of the sensors revealed the sensors have an accuracy on the average of 0.01 μm with a maximum-minimum difference of 0.06 μm.

When the carriers held no wafer and were interposed between the upper and lower turn tables, the height position of the upper turn table was detected by using the laser displacement sensors, and the reference position was set to the detected height position. A crystal for measuring the thickness of wafers was then inserted into the holding hole located in the center of each of the carriers depicted in FIG. 1B, and four silicon wafers were inserted into the holding holes around the holding hole located in the center of each of the carriers.

The height positions of the upper turn table was then detected by the laser displacement sensors in a state in which the carriers holding the wafers were interposed between the upper and lower turn tables, and the differences between the respective detected height positions and the reference position were calculated. It was determined that the wafer were not normally held when at least one of the differences exceeded a threshold of 0.15 mm. The lapping of the wafers was started after removing the failure in holding.

Figure 4:
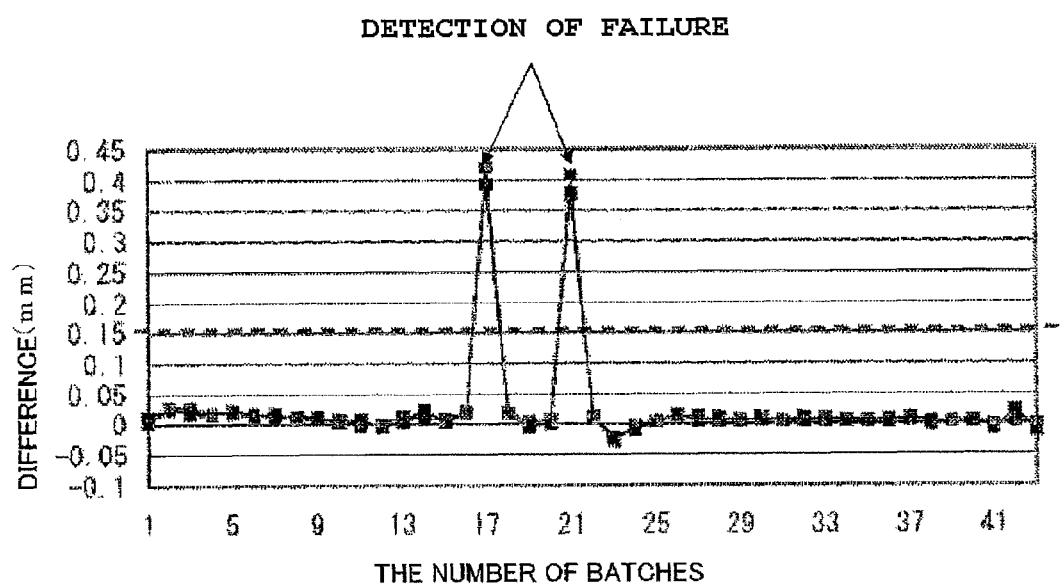
FIG. 4 is a diagram of the results of Example.
Figure 5A:
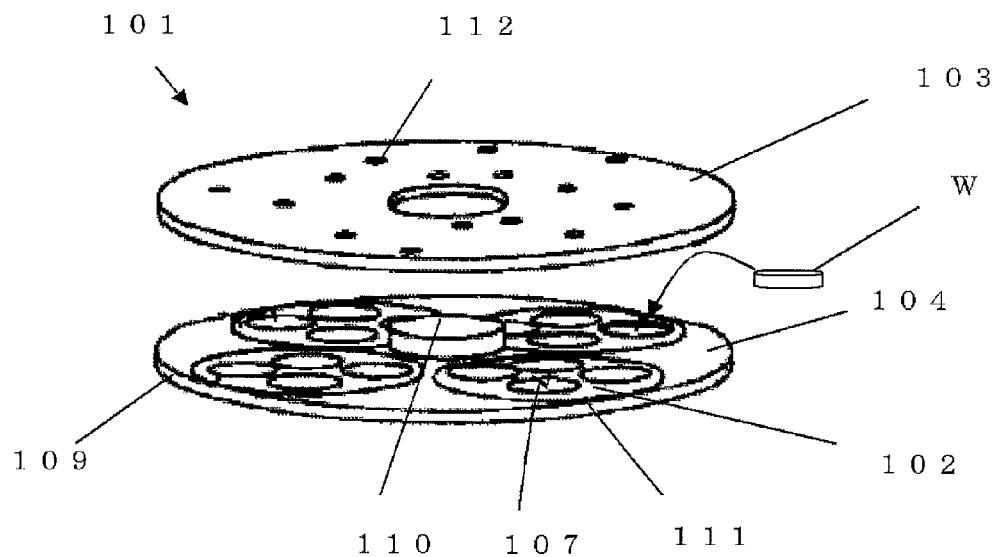
FIG. 5A is a schematic view of a common lapping apparatus.
Figure 5B:
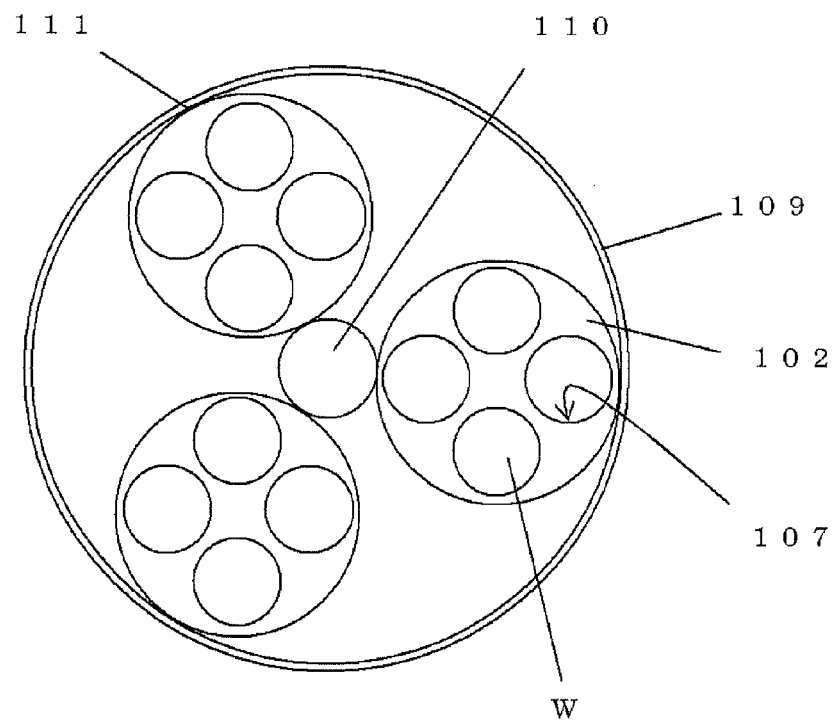
FIG. 5B is a top schematic view of the apparatus in FIG. 5A.

The results obtained by repeating the above lapping are given in FIG. 4. As shown in FIG. 4, the failure in holding actually occurred twice, and both of the failures were detected. In all lapping processes except these two cases, it was determined that the wafers were normally held, and break of the wafer did not occur. The accuracy of detection of the failure in holding was 100%.

It was accordingly confirmed that the method for processing a wafer of the present invention can automatically detect accurately whether the wafer is not normally held, due to the failure in holding, before processing to prevent the wafer from breaking and eliminate the necessity of operator's inspection using touch to improve operation efficiency.

Comparative Example

Silicon wafers were lapped under the same conditions as those of Example except for detecting the failure in holding by an operator.

During the lapping, the failure in holding was overlooked and one wafer was broken.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for processing a wafer by inserting the wafer into a holding hole of a carrier to hold the wafer, and interposing the carrier holding the wafer between an upper turn table and a lower turn table to process both surfaces of the wafer at the same time, the method comprising the steps of:
   before processing the wafer, detecting a height position of the upper turn table by a laser displacement sensor while interposing the carrier holding the wafer between the upper turn table and the lower turn table; and
   determining that the wafer is not normally held to redo the holding of the wafer by inserting the wafer into a holding hole of a carrier if a difference between the detected height position and a reference position exceeds a threshold, wherein:
   the laser displacement sensor is a CCD laser micrometer of a transmission type, and
   a sensor dog is disposed in a shaft that is movable upward and downward along an up and down movement of the upper turn table, and the sensor dog is positioned to block a laser of the CCD laser micrometer of a transmission type when the carrier holding the wafer is interposed between the upper and lower turn table.

2. The method for processing a wafer according to claim 1, wherein
   the reference position is a height position of the upper turn table detected, before the detecting step, by the laser displacement sensor while interposing the carrier holding no wafer between the upper turn table and the lower turn table.

3. The method for processing a wafer according to claim 1, wherein
   a crystal for measuring a thickness of the wafer is held in a holding hole provided in the carrier separately from the holding hole for holding the wafer to determine whether the crystal is not normally held, together with determining that the wafer is not normally held.

4. The method for processing a wafer according to claim 2, wherein
   a crystal for measuring a thickness of the wafer is held in a holding hole provided in the carrier separately from the holding hole for holding the wafer to determine whether the crystal is not normally held, together with determining that the wafer is not normally held.

* * * * *